(12) United States Patent
Miyamoto et al.

(10) Patent No.: US 7,880,091 B2
(45) Date of Patent: Feb. 1, 2011

(54) ELECTRONIC DEVICE SUBSTRATE, ELECTRONIC DEVICE AND METHODS FOR MAKING SAME

(75) Inventors: Nobuaki Miyamoto, Hitachi (JP); Akira Chinda, Hitachi (JP); Koki Hirasawa, Kawasaki (JP); Kenji Uchida, Kawasaki (JP)

(73) Assignees: Hitachi Cable, Ltd., Tokyo (JP); Renesas Electronics Corporation, Kanagawa (JP)

( * ) Notice: Subject to any disclaimer, the term of this patent is extended or adjusted under 35 U.S.C. 154(b) by 643 days.

(21) Appl. No.: 11/645,948

(22) Filed: Dec. 27, 2006

(65) Prior Publication Data
US 2007/0269590 A1 Nov. 22, 2007

(30) Foreign Application Priority Data
May 22, 2006 (JP) .............................. 2006-141862

(51) Int. Cl.
*H05K 1/03* (2006.01)
(52) U.S. Cl. ..................................... 174/255; 174/260
(58) Field of Classification Search ................. 174/260, 174/261, 254, 255
See application file for complete search history.

(56) References Cited

U.S. PATENT DOCUMENTS

| | | | |
|---|---|---|---|
| 6,346,335 B1 * | 2/2002 | Chen et al. | 428/629 |
| 6,635,957 B2 * | 10/2003 | Kwan et al. | 257/691 |
| 7,064,011 B2 * | 6/2006 | Ikenaga et al. | 438/118 |

FOREIGN PATENT DOCUMENTS

| | | |
|---|---|---|
| JP | A-3-94459 | 4/1991 |
| JP | A-3-99456 | 4/1991 |
| JP | A-9-252014 | 9/1997 |
| JP | A-2002-9196 | 1/2002 |

* cited by examiner

*Primary Examiner*—Ishwarbhai B Patel
(74) *Attorney, Agent, or Firm*—Scully, Scott, Murphy & Presser, PC

(57) ABSTRACT

An electronic device substrate having: a base material formed of a thin board; an electrical insulation layer formed on the base material and having plural openings in a thickness direction thereof; and a metal plating layer filled in the plural openings. The base material has a metal layer, a release layer formed contacting the metal layer, and a metal film formed contacting the release layer.

4 Claims, 13 Drawing Sheets

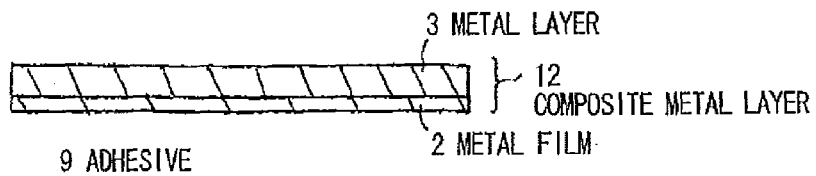
FIG. 2A
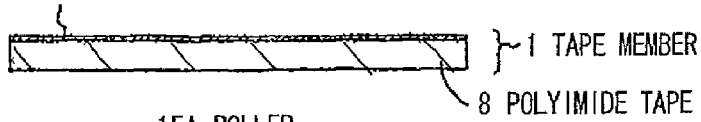
FIG. 2B
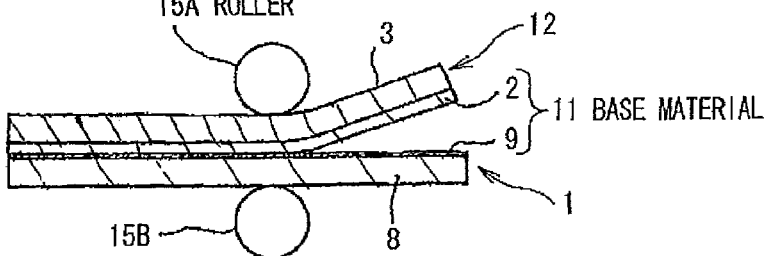
FIG. 2C
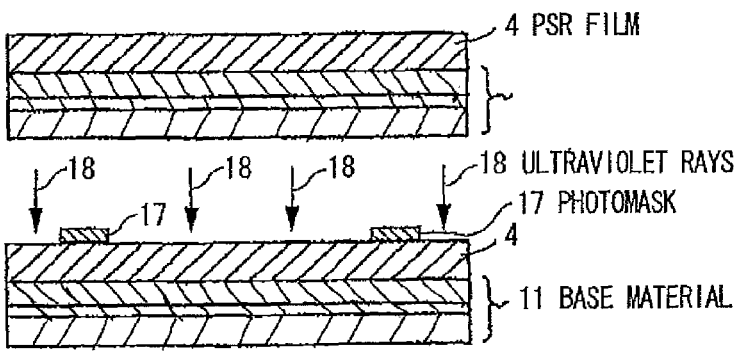
FIG. 2D
FIG. 2E
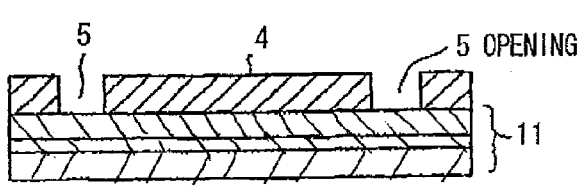
FIG. 2F
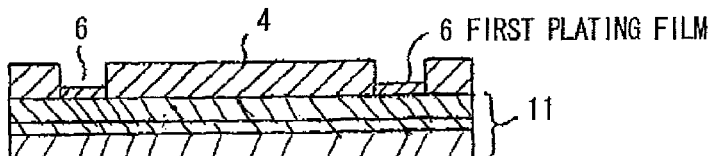
FIG. 2G
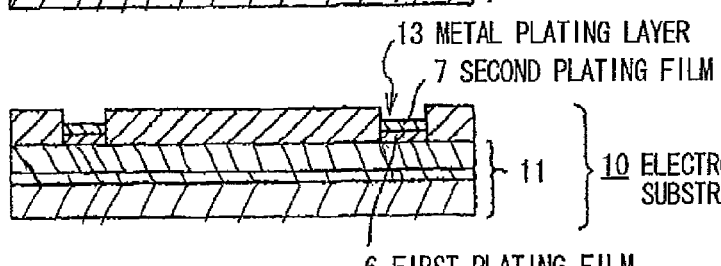
FIG. 2H
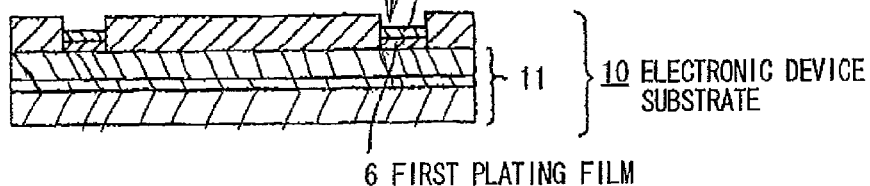

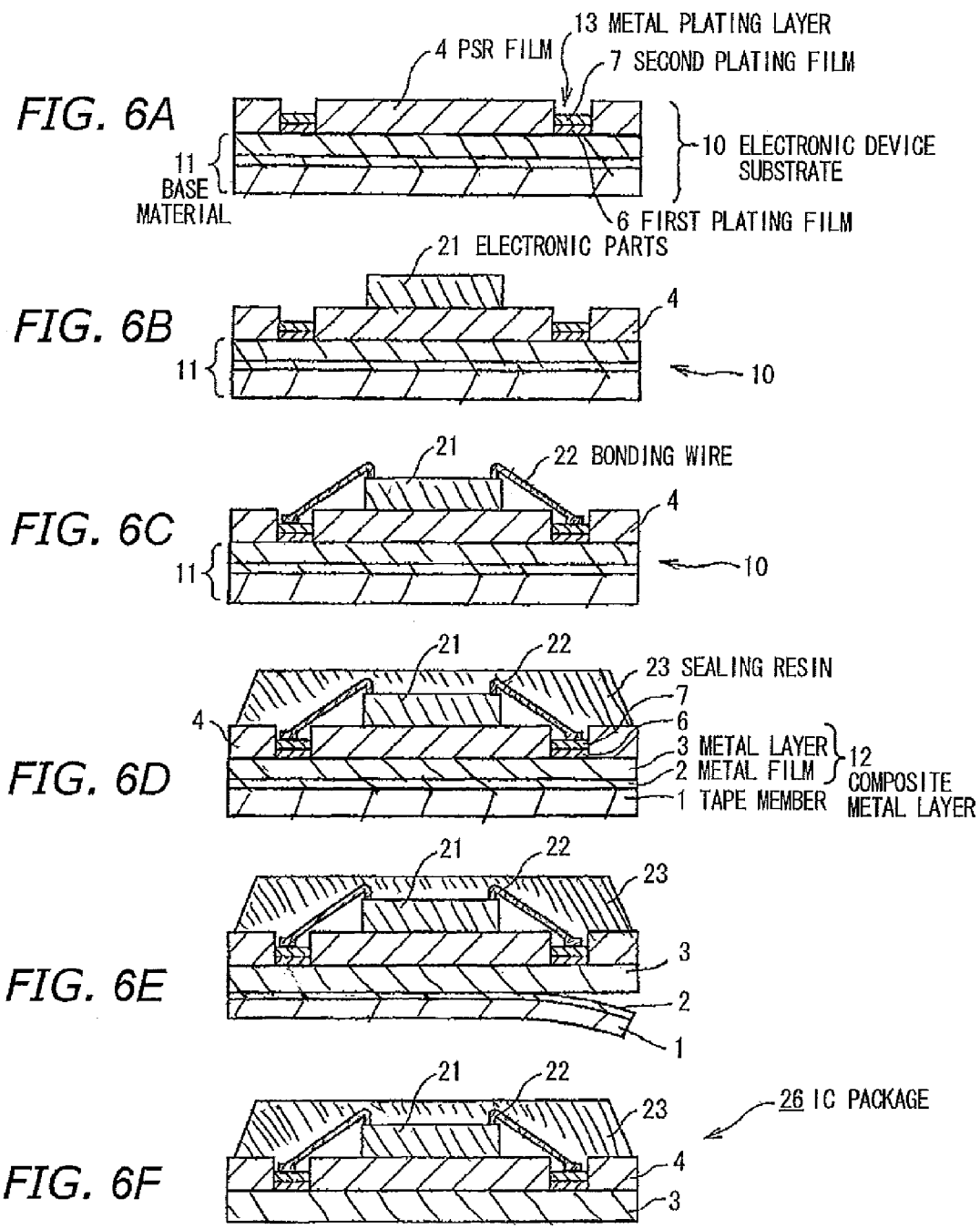

ELECTRONIC DEVICE SUBSTRATE, ELECTRONIC DEVICE AND METHODS FOR MAKING SAME

The present application is based on Japanese patent application No. 2006-141862, the entire contents of which are incorporated herein by reference.

BACKGROUND OF THE INVENTION

1. Field of the Invention

This invention relates to an electronic device substrate, an electronic device and methods for making the same and, in particular, to an electronic device that, despite having a coreless type structure advantageous to thinning or downsizing, is less likely to have a crack during its production process and has a structure advantageous for external mounting and a method of making the same. Also, this invention relates to an electronic device substrate used for the electronic device and a method of making the same.

2. Description of the Related Art

FIGS. 8A and 8B are a cross sectional view and a top view (mounting surface), respectively, showing a conventional electronic device.

The electronic device 100 comprises: a wiring substrate 102 with a through hole 103 formed therein; a die pad 104 formed on the wiring substrate 102; plural wiring patterns 105 which are formed on the wiring substrate 102 and each have a metal electrode 105a and an internal connecting terminal 105b formed on both ends thereof; an electronic parts 106 mounted and bonded onto the die pad 104 through a conductive paste etc. (not shown); plural external electrode pads 107 formed on the bottom of the wiring substrate 102 and connected to the lower end of the through hole 103; ball-shaped external connecting terminals 108 formed on the external electrode pads 107; bonding wires 109 formed of Au wire etc. and connecting a terminal 106a with the internal connecting terminal 105b; and a sealing resin 110 formed on the wiring substrate 102 to cover the electronic parts 106 and the bonding wires 109.

The wiring substrate 102 is formed of glass epoxy resin, polyimide tape etc.

The through hole 103 is a conductor for electrically connecting the metal electrode 105 with the external electrode pad 107. The die pad 104, the wiring pattern 105 and the external electrode pad 107 are made of a copper foil etc. formed by photochemical etching etc.

The through hole 103, the die pad 104, the wiring pattern 105 and the external electrode pad 107 are provided with copper plating, nickel base plating, gold plating etc.

The electronic device 100 as shown in FIG. 8A is produced such that the electronic parts 106 is mounted on the die pad 104 of the wiring substrate 102, the terminal 106a of the electronic parts 106 is connected through the bonding wires 109 to the internal connecting terminal 105b, and the sealing resin 110 formed of epoxy resin etc. is formed thereon. Typically, in the final step, the ball-shaped external connecting terminal 108 such as a solder ball is attached onto the external electrode pad 107.

Recently, a coreless type electronic device (hereinafter called coreless package) is proposed which does not use a module substrate. For example, JP-A-3-94459 (pages 3-4 and FIG. 1) discloses a coreless package that electronic parts is die-bonded on a base film and wire-bonded to a metal base, and then unnecessary parts of the metal base is removed by etching to expose terminals and a mounting portion.

FIG. 9 shows the structure of the coreless package as disclosed in JP-A-3-94459. The coreless package 120 is constructed such that the wiring substrate 102, as an insulating core substrate, in FIG. 8A is removed, and the back surface of the die pad 104 and the wiring pattern 105 is exposed on the bottom of the package.

JP-A-3-99456 (pages 2-3 and FIG. 1) discloses a coreless package with plural electronic parts elements. The coreless package is constructed such that the plural electronic parts are wire-bonded to a circuit pattern, these are resin-sealed integrally, a protective coat is formed on the bottom of the package, and gold plating for corrosion prevention is formed on the circuit pattern exposed at an opening of the protective coat.

FIGS. 10A to 10E show a method of making the coreless package 120 as shown in FIG. 9.

First, as shown in FIG. 10A, on an insulating transfer film 121 as a core substrate, the die pad 104, and the wiring pattern 105 having the metal electrode 105a and the internal connecting terminal 105b are formed.

Then, as shown in FIG. 10B, the electronic parts 106 is mounted on the die pad 104. Then, as shown in FIG. 10C, the terminal of the electronic parts 106 is connected through the bonding wires 109 to the internal connecting terminal 105b.

Then, as shown in FIG. 10D, the electronic parts 106 is sealed with the sealing resin 110. Then, by removing the transfer film 121, the coreless package 120 as shown in FIG. 10E can be obtained. This method is generally called transfer method, where the wiring conductor is transferred to the side of the sealing resin 110.

JP-A-9-252014 (paragraphs [0007]-[0010] and FIG. 2) discloses a transfer method for making the coreless package by using a thick base material instead of the transfer film. This method is conducted such that a metal foil is pasted to the base material, an electronic parts is mounted on the metal foil and wire-bonded, a resin is sealed thereon, and the sealing resin is separated from the based material.

JP-A-2002-9196 (paragraphs [0016]-[0025] and FIGS. 2-3) discloses a transfer-like method for making the coreless package where the metal base located at the bottom is etched. This method is conducted such that a resist pattern is formed on the metal base as a core substrate, openings are formed in the resist pattern corresponding to a die bonding portion and a bonding portion, the opening is filled with nickel plating and gold plating is formed on the surface of the nickel plating, the resist pattern is removed, an electronic parts is mounted on the die bonding portion, wire bonding is made onto a gold plating film as the bonding portion, a resin is sealed thereon, and the metal base is removed by etching.

Conductors for the die pad, the internal connecting terminal, the wiring pattern, the external connecting electrode etc. are typically formed of a copper foil such as an electrolytic copper foil, a rolled copper foil etc. The copper foil is patterned by photochemical etching to form the die pad, the internal connecting terminal, the wiring pattern, the external connecting electrode etc.

FIG. 11 shows the detailed composition of a transfer film unit including the transfer film 121 as shown in FIG. 10A. The transfer film unit comprises: an adhesive 122 coated on the transfer film 121; the die pad 104 and the wiring pattern 105 formed on the adhesive 122; and a functional plating 123 formed on the surface of the die pad 104 and the wiring pattern 105.

The functional plating 123 is used to facilitate the connection between the terminal of the electronic parts 106 and the metal electrode 105. For example, the functional plating 123 is formed of, as a base plating, an electroless nickel plating or electrical nickel plating, and an electroless gold plating or electrical gold plating formed thereon.

In general, the electrical nickel plating is formed 0.5 to 2.0 μm in thickness depending on heating conditions in the mounting or wire bonding of electronic parts. The base nickel plating serves as a prevention film (or a barrier film) for thermal diffusion of copper into gold plating film. The gold plating is formed as a surface layer since it has high connection reliability in ultrasonic wire bonding. Its thickness is desired to be as thick as possible to enhance the wire-bonding performance, but its optimum thickness is selected 0.1 to 2.0 μm in view of the productivity and manufacturing cost.

However, the conventional electronic devices each have the following problems.

The composition as shown in FIG. 11 has a problem that the gold plating of the functional plating 123 is poor in adhesiveness with the sealing resin 110. Namely, when the gold plating is formed on the surface of the functional plating 123, adhesiveness with the sealing resin deteriorates to lower the reliability of the electronic device since the gold does not create any oxide film with high electro negativity thereon.

The BGA structure as shown in FIG. 8A is advantageous in that the external mounting of the electronic device is rendered easy by the protruding external terminal 108 such as a solder ball. However, the distance between adjacent electrodes has to be more than the diameter of the ball. Further, the total thickness of the electronic device must be increased since the diameter of the ball is added to the thickness of the electronic device.

In producing the coreless package 120 as shown in FIGS. 10A to 10E, the transfer film 121 is removed in the final step. However, the adhesive 122 provided on the transfer film 121 may be left on the back surface of the metal electrode 105a even after separating the transfer film 121. Further, the transfer film 121 may be partially left thereon due to the imperfect separation.

In order to solve this problem, JP-A-2002-9196 discloses a method of connecting the metal base, as a core substrate, and the electrode through a metal with low adhesiveness. However, in this method, if the adhesive force between the transfer film 121 and the wiring pattern 105 is more than that between the sealing resin 110 and the wiring pattern 105, the wiring pattern 105 may be separated from the sealing resin 110 while adhering to the transfer film 121 when the transfer film (=core substrate) 121 is peeled off.

In order to solve this problem, JP-A-2002-9196 discloses a further method that the metal for the wiring pattern is thickened and an extended portion is, at the periphery, provided which extends slightly to the side of the sealing resin. However, this method causes an increase in plating time to have the increased thickness of the wiring pattern. Further, the resist film needs to be removed while keeping the shape of the apprentice (=extended portion). Because of these, it is difficult to shorten the distance between adjacent electrodes. As a result, the size of the electronic device must be increased.

Further, when the metal base is peeled off by applying a mechanical stress, the stress may cause warp or crack in the electronic device. Therefore, such a method is not suitable for the formation of, especially a low-profile electronic device.

Further, as shown in FIG. 9, it is impossible to form the wiring pattern 105 under the electronic parts 106 since the die pad 104 is placed there. Thus, the conventional coreless package designs have the problem that the mounting area of the coreless package 120 cannot be reduced.

SUMMARY OF THE INVENTION

It is an object of the invention to provide an electronic device that can have a reduced mounting area while having the low-profile and down-sized coreless structure.

It is a further object of the invention to provide a method of making such an electronic device, an electronic device substrate used for such an electronic device, and a method of making the electronic device substrate.

(1) According to one aspect of the invention, an electronic device substrate comprises:

a base material formed of a thin board;

an electrical insulation layer formed on the base material and comprising a plurality of openings in a thickness direction thereof; and a metal plating layer filled in the plurality of openings, wherein the base material comprises a metal layer, a release layer formed contacting the metal layer, and a metal film formed contacting the release layer.

In the above invention (1), the following modifications and changes can be made.

(i) The base material comprises, formed in order from the electrical insulation layer, the metal layer, the release layer, the metal layer, a tape member, and an adhesion force between the metal layer and the release layer with the metal film is smaller than that between the metal layer and the electrical insulation layer.

(ii) The electrical insulation layer comprises a solder resist, a photo-solder resist or a polyimide film.

(iii) The metal plating layer comprises any one of gold, silver, copper, nickel, palladium, tin, rhodium and cobalt or an alloy thereof or laminated layers each formed of any one thereof or an alloy thereof.

(2) According to another aspect of the invention, a method of making an electronic device substrate comprises the steps of:

forming a base material by laminating a composite metal layer comprising a metal layer, a release layer and a metal film on a tape member;

forming an electrical insulation layer on the metal layer of the base material;

forming an opening in the electrical insulation layer; and filling the opening with a metal plating layer.

(3) According to another aspect of the invention, an electronic device comprises:

an electronic parts comprising an external connection electrode;

an electrical insulation layer on a surface of which the electronic parts is mounted and comprises a plurality of openings in a thickness direction thereof;

a metal plating layer filled in the plurality of openings of the electrical insulation layer and electrically connected to the electrode of the electronic parts;

an insulating covering material that covers a connection surface of the metal plating layer to the electronic parts and the electronic parts; and a conductive structure formed contacting the metal plating layer on an other surface of the electrical insulation layer.

In the above invention (3), the following modifications and changes can be made.

(iv) The conductive structure comprises a surface treatment layer formed thereon.

(v) The conductive structure comprises an external connection protruding terminal.

(vi) The conductive structure comprises a conductor wiring layer (e.g., with a rectangular shape in its cross section).

(4) According to another aspect of the invention, a method of making an electronic device comprises the steps of:

providing an electronic device substrate comprising: a base material formed of a thin board, the base material comprising a tape member and, sequentially formed on the tape member, a metal film; a release layer and a metal layer, an electrical insulation layer formed on the base material and a plurality of openings in a thickness direction thereof; and a metal plating layer filled in the plurality of openings;

mounting an electronic parts on the electronic device substrate, electrically connecting an electrode of the electronic parts to the metal plating layer, and subsequently covering at least the electrical connection between the electronic parts and the metal plating layer with an insulating covering material;

removing the tape member and the metal film from the electronic device substrate by using the release layer to leave the metal layer with the electronic device substrate; and forming a conductive structure at a position corresponding to the metal plating layer by processing the metal layer by using a photo fabrication (e.g., a selective chemical etching).

In the above invention (4), the following modifications and changes can be made.

(vii) The conductive structure comprises an external connection protruding terminal.

(viii) The method further comprises the step of:

forming a surface treatment layer on a surface of the conductive structure by using a plating method.

(ix) The conductive structure comprises a conductor wiring layer (e.g., with a rectangular shape in its cross section) to compose a conductor circuit.

(x) The method further comprises the steps of:

forming a surface treatment layer on a surface of the conductive structure by using a plating method; and forming a second electrical insulation layer on a part of the surface treatment layer.

In the above invention (3) or (4), the following modifications and changes can be made.

(xi) The electronic device further comprises:

a conductor wiring layer formed on the other surface of the electrical insulation layer and under the electronic parts.

(xii) The method further comprises the step of:

forming a conductor wiring layer on a bottom surface of the electrical insulation layer and under the electronic parts.

(5) According to another aspect of the invention, a coreless package comprises:

an insulating base material comprising an opening in a thickness direction thereof;

an electronic parts mounted on the insulating material;

a metal plating layer formed in the opening and electrically connected to the electronic parts;

an insulating covering material that covers the metal plating layer and the electronic parts, wherein the insulating base material is formed of a different material than the insulating covering material.

In the above invention (5), the following modifications and changes can be made.

(xiii) The coreless package further comprises:

a conductive structure formed contacting the metal plating layer on a bottom surface of the insulating base material.

(xiv) The coreless package further comprises:

a conductor wiring layer formed on a bottom surface of the insulating base material and under the electronic parts.

ADVANTAGES OF THE INVENTION

In accordance with the invention, an electronic device can be provided that has a reduced mounting area while having the low-profile and down-sized coreless structure as well as preventing a crack in its production process. Thus, the electronic device is suitable for the external mounting.

BRIEF DESCRIPTION OF THE DRAWINGS

The preferred embodiments according to the invention will be explained below referring to the drawings, wherein:

FIGS. 2A to 2H are cross sectional views showing a method of making the electronic device substrate in FIG. 1;

FIGS. 6A to 6K are cross sectional views showing a method of making the electronic device substrate in FIG. 5;

FIG. 7A is a transparent top view showing the conventional coreless package, FIG. 7B is a cross sectional view cut along a line A-A' in FIG. 7A, FIG. 7C is a transparent top view showing the electronic device of the third embodiment, and FIG. 7D is a cross sectional view cut along a line A-A' in FIG. 7C;

DETAILED DESCRIPTION OF THE PREFERRED EMBODIMENTS

First Embodiment

Composition of Electronic Device Substrate

Figure 1:
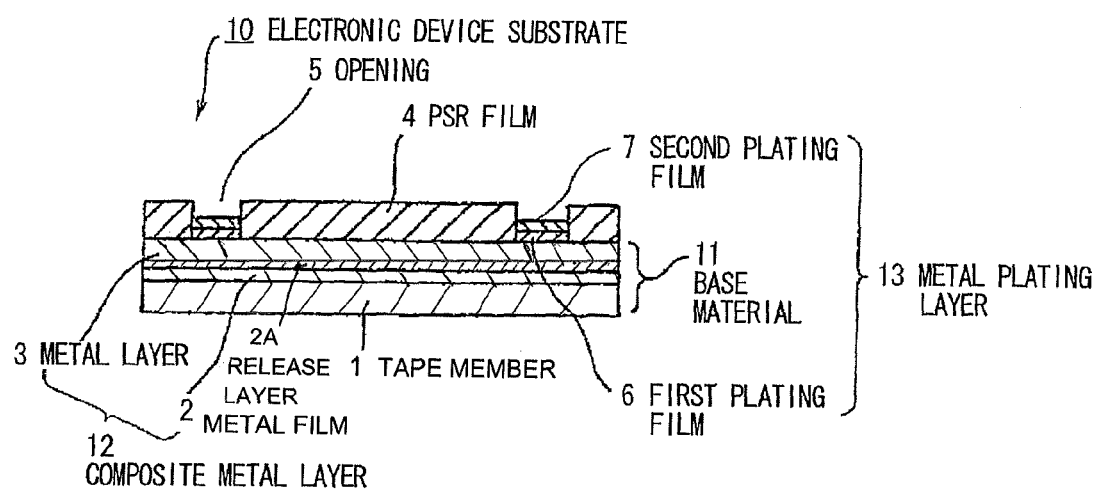
FIG. 1 is a cross sectional view showing an electronic device substrate in a first preferred embodiment according to the invention.

FIG. 1 shows an electronic device substrate in the first preferred embodiment according to the invention.

The electronic device substrate 10 comprises: a composite metal layer (or composite copper foil) 12 that a metal layer 3 formed of a copper-foil as a base material is provided with a release layer 2A as shown in FIG. 1 (may not be shown in other FIGs.) formed thereon and a thin metal film 2 is formed on the release layer 2A; a tape member 1 that is attached through an adhesive 9 (See FIG. 2B) to the composite metal layer 12; a PSR film 4 that is, as a first insulation layer, formed on an opposite surface of the metal layer 3 with a predetermined pattern; a first plating film 6 that is formed in an opening 5 formed at a predetermined position of the PSR film 4; and a second plating film 7 that is formed on the first plating film 6.

The metal layer 3 is desirably formed of a copper foil due to its availability, cost, high electrical conductivity, removal easiness in the final step etc. Alternatively, it may be formed of a stainless foil, aluminum or aluminum alloy foil, nickel or nickel alloy foil, or tin or tin alloy foil.

The PSR film 4 can be formed of an organic resist film, e.g., an insoluble solder resist or photo-solder resist.

The first plating film 6 is suitably formed of nickel, tin, solder plating etc. in use for solder mounting. It is suitably formed of gold, silver, palladium nickel etc. in use for pressure-welding mounting with anisotropic conductive film (ACF), anisotropic conductive paste (ACP), non-conductive film (NCF), non-conductive paste (NCP) etc.

The second plating film 7 is used to have electrical connection with electrodes of electronic parts. It can be formed of gold, silver, palladium etc. Meanwhile, in case of flip-chip connection of electronic parts with a gold bump or a solder bump formed thereon, it needs to be formed of gold, tin, palladium, solder plating etc.

The first plating film 6 and the second plating film 7 compose a metal plating layer 13 and are used as a wiring pattern for the electronic device.

Method of Making the Electronic Device Substrate

A method of making the electronic device substrate of the first embodiment will be explained below. FIGS. 2A to 2H are cross sectional views showing the method of making the electronic device substrate in FIG. 1.

First, as shown in FIG. 2A, the composite metal layer (or composite copper foil) 12 is provided which has the metal layer 3 formed of a 18 μm thick rolled copper-foil, the release layer (not shown) formed thereon, and the metal film 2 of a very thin copper foil formed on the release layer. The composite metal layer 12 may be "Copper Bond Extra Thin Foil" XTF, registered trade mark, available from Olin Corp.

Such a composite copper foil is called a copper foil with carrier. A core substrate with carrier means a base material which is produced such that a release layer with a low adhesiveness to allow its release in a following step is formed on a carrier layer formed of a more than 18 μm thick metal foil (mostly copper foil), and then a thin metal foil is formed thereon by electrolysis.

Instead of the "Copper Bond Extra Thin Foil" XTF of Olin corp., the metal foil with carrier may be "Micro Thin" available from Mitsui Mining And Smelting Company, Ltd. The latter is a base material which uses an organic release layer as the release layer and the other components thereof are the same as the former. Both of the base materials can allow the release of the thick base carrier layer from the surface metal layer (i.e., ultra-thin copper layer) by a small force of about 20 N/m. Especially the former uses an inorganic release layer and, therefore, can allow the easy release even after heating higher than 400° C. Thus, the copper foil with carrier (i.e., the latter) using the organic release layer is disadvantageous in that its upper temperature limit is as low as 230° C., as compared to the copper foil with carrier (i.e., the former) using the inorganic release layer.

On the other hand, as shown in FIG. 2B, a tape member 1 is provided which is formed of a polyimide tape 8 and an adhesive 9 coated thereon. In this embodiment, a 25 μm thick "Upilex" from UBE Industries, Ltd. is used as the polyimide tape 8, and "X series" from TOMOEGAWA Co., Ltd. is used as the adhesive 9.

Then, as shown in FIG. 2C, the tape member 1 and the composite metal layer 12 are laminated by roll laminating while facing the adhesive 9 and the metal film 2 each other so as to make a base material 11. Thus, the base material 11 has a five layer composition which has, in the order from the surface layer, the rolled copper foil (=the metal layer 3: 18 μm)/the release layer (about 100 (angstroms)/the ultra-thin copper foil (=the metal layer 2: 3 μm)/the adhesive 9 (12 μm)/the support substrate (=the polyimide tape 8: 25 μm).

Then, as shown in FIG. 2D, the PSR film 4 as the first insulation layer is coated 15 μm thick on the metal layer 3 of the base material 11 by screen printing. Then, as shown in FIG. 2E, ultraviolet lays 18 are irradiated to the PSR film 4 through a photomask 17. Then, as shown in FIG. 2F, the opening 5 with a predetermined shape is formed in the PSR film 4 by a development process.

Then, the substrate in FIG. 2F is soaked into electrolytic nickel plating solution, and the first plating film 6 as shown in FIG. 2G is formed 0.5 μm thick in the opening 5 by nickel plating while using the ultra-thin copper film as a negative electrode.

Then, it is soaked into electrolytic gold plating solution, and the second plating film 7 as shown in FIG. 2H is formed 0.5 μm thick in the opening 5 by gold plating. Then, by sufficiently washing and drying it, the electronic device substrate 10 is obtained.

Effects of the First Embodiment

The following effects can be obtained by the first embodiment of the invention.

(1) Since the composite metal layer 12 has, as a support board, the tape member 1 attached to the metal film 2, the thickness to the polyimide tape 8 can be well balanced. Thus, the separation of the polyimide tape 8 can be smoothly conducted.

(2) Since the PSR film 4 and the metal plating layer 13 are as thin as less than 30 μm, the microscopic processing can be facilitated. Further, since they have only a thickness and a projected area slightly greater than that of the electronic parts mounted thereon, the electronic device can be rendered small-sized and low-profile.

(3) It is not necessary to form the microscopic pattern by etching the copper foil. Thus, resist coating, exposure, development, and etching steps for photo-etching can be rendered unnecessary.

(4) Since the PSR film 4 used to form the opening 5 is not dissolved and removed by release solution after the plating, pollution is not caused by the release solution. Further, time required for the substrate manufacture can be reduced by that much to reduce the manufacturing cost.

(5) Since the insoluble solder resist or photo-solder resist is used as the PSR film 4, it is unnecessary to dissolve and remove the resist film for the plating by the release solution. Therefore, pollution is not caused by the release solution. Further, time required for the substrate manufacture can be reduced by that much to reduce the manufacturing cost.

Second Embodiment

Composition of Electronic Device

Figure 3:
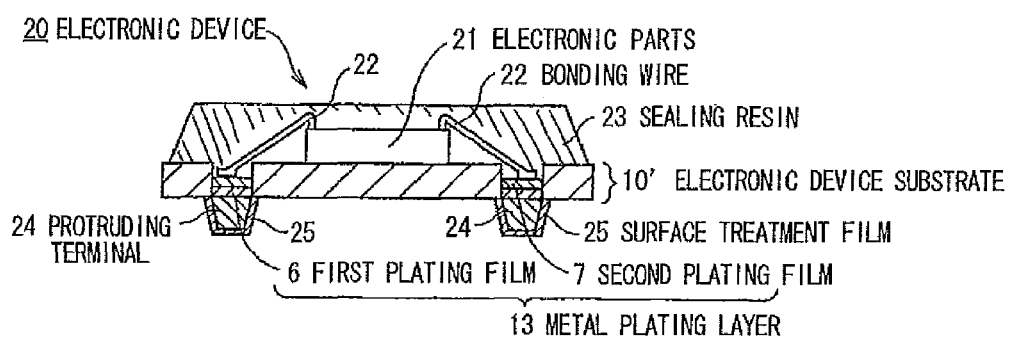
FIG. 3 is a cross sectional view showing an electronic device substrate in a second preferred embodiment according to the invention.

FIG. 3 is a cross sectional view showing an electronic device substrate in the second preferred embodiment according to the invention.

The electronic device 20 comprises: an electronic device substrate 10' that is formed by removing the base material 11 from the electronic device substrate 10 of the first embodiment; an electronic parts 21 mounted at a predetermined position on the electronic device substrate 10'; bonding wires 22 that connects an external connection terminal (not shown) on the electronic parts 21 to the second plating film 7 of the electronic device substrate 10'; a sealing resin 23, as insulating covering material, formed on the electronic device substrate 10' to cover the electronic parts 21, the bonding wires 22 and the second plating film 7; a protruding terminal 24 formed on the back surface of the PSR film 4 and contacting the first plating film 6; and a surface treatment film 25 formed on the surface of the protruding terminal 24.

Method of Making the Electronic Device

A method of making the electronic device of the second embodiment will be explained below. FIGS. 4A to 4K are cross sectional views showing the method of making the electronic device in FIG. 3.

Figure 4A:
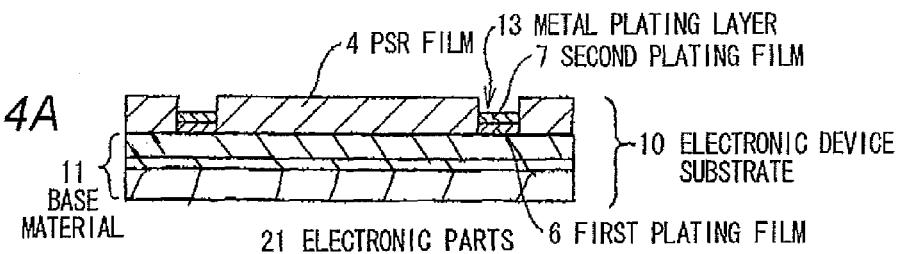
FIGS. 4A to 4K are cross sectional views showing a method of making the electronic device substrate in FIG. 3.
Figure 4B:
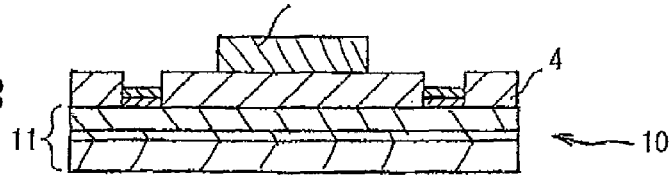
Figure 4C:
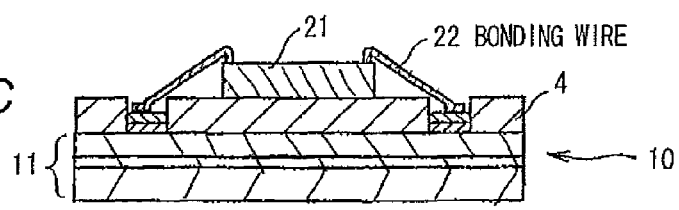

First, as shown in FIG. 4B, the electronic parts 21 (which is exemplified by an IC chip in this embodiment) is bonded through a die bonding paste at a predetermined position on of the PSR film 4 of the electronic device substrate 10 as shown in FIG. 4A (and which is also shown in FIG. 1). Then, as shown in FIG. 4C, the aluminum electrode terminal of the electronic parts 21 is electrically connected through the gold bonding wires 22 to the second plating film 7 of the electronic device substrate 10.

Figure 4D:
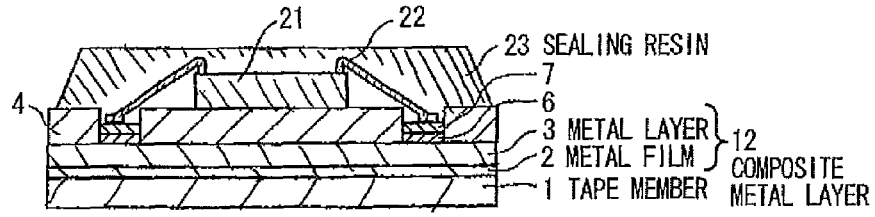
Figure 4E:
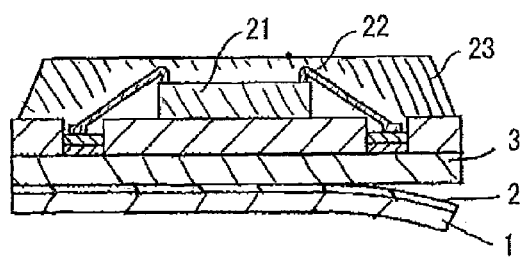

Then, as shown in FIG. 4D, the sealing resin 23 is formed on the electronic parts 21, the bonding wires 22 and the second plating film 7 so as to protect the electronic parts 21 and the bonding portions from the external environment. Then, as shown in FIG. 4E, the tape member 1 with the metal layer 2 is separated from the metal layer 3 to expose the metal layer 3 and to have an IC package 26 (See FIG. 4F).

Figure 4F:
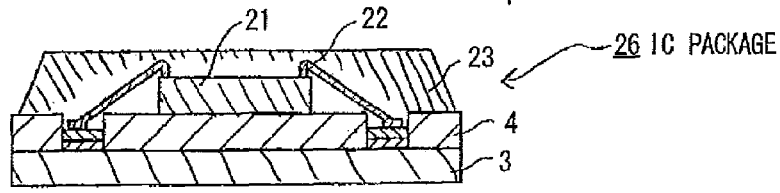

The seven-layer composition as shown in FIG. 4D is, in the order from the top layer, the sealing resin 23 or the electronic parts 21 with the die bonding paste or the bonding wires 22 (gold wires)/the PSR film 4 or the first and second plating films 6, 7/the rolled copper foil (=metal layer 3)/the release layer (not shown)/the ultra-thin copper foil (=metal film 2)/the adhesive 9 (See FIG. 2B)/the support substrate (=the polyimide tape 8: See FIG. 2B). Above all, the adhesion force at the interface of the rolled copper foil (=metal layer 3) and the ultra-thin copper foil (=metal film 2) through the release layer is 20 N/m considerably small as compared to the adhesion force, greater than 1000 N/m, at the other interfaces. Therefore, the tape member 1 with the metal layer 2 and the release layer can be securely separated from the metal layer 3 to expose the bottom of the metal layer 3 (=rolled copper foil) as shown in FIG. 4F.

Figure 4G:
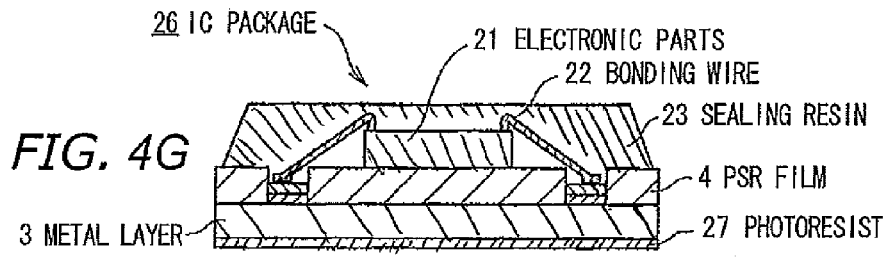
Figure 4H:
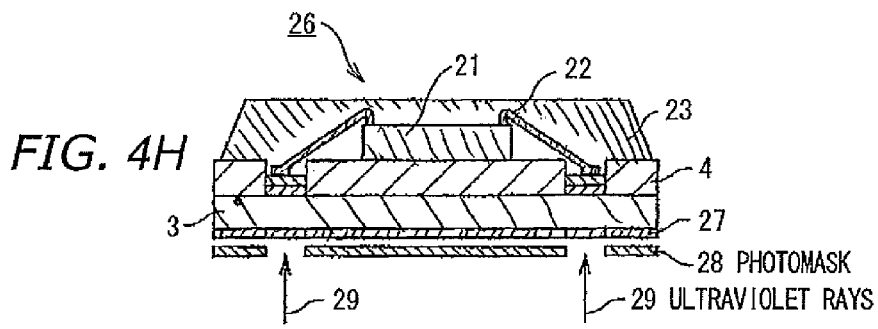
Figure 4I:
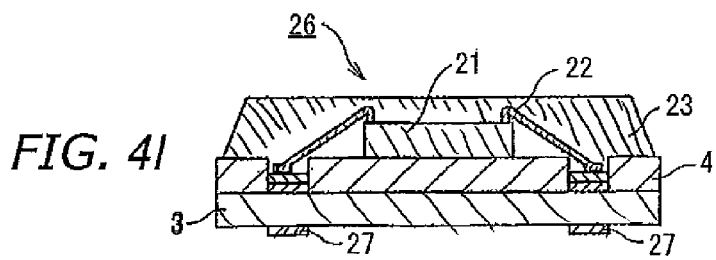

Then, as shown in FIG. 4G, a negative type photoresist 27 is coated on the surface of the metal layer 3 at the bottom of the IC package 26. Then, as shown in FIG. 4H, ultraviolet rays 29 are irradiated through a photomask 28 onto corresponding position to the metal plating layer 13 from the bottom side of the electronic device. Then, as shown in FIG. 4I, a developing solution is sprayed thereon to remove the photoresist 27 at the position where the ultraviolet rays 29 are not irradiated.

Figure 4J:
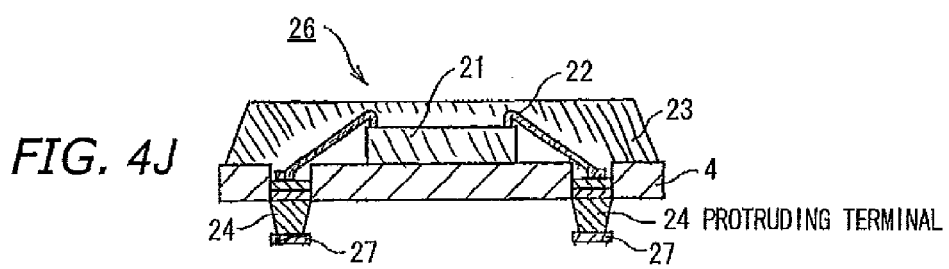

Then, as shown in FIG. 4J, the copper foil (=metal layer 3) at the position where the photoresist 27 is removed is chemically etched to form the protruding terminal 24. Since the PSR film 4 is formed of the insoluble solder resist or photosolder resist, it serves as a protection film in the chemical etching so as not to cause the penetration of the etchant into the inside of the electronic device.

Figure 4K:
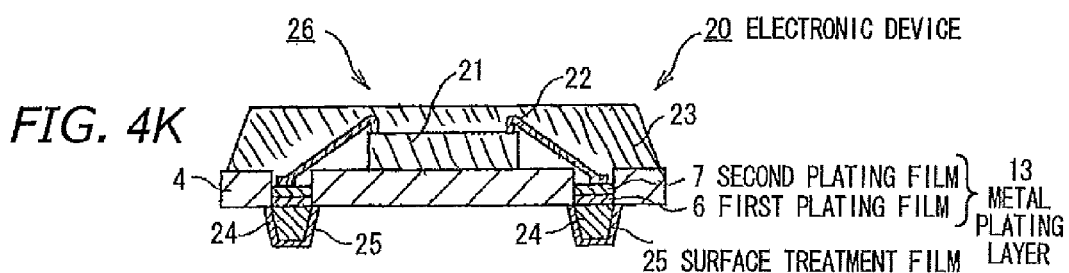

After the chemical etching, the remaining resist is removed by spraying a resist removing solution. Finally, as shown in FIG. 4K, the surface treatment film 25 is formed on the surface of the protruding terminal 24 by electroless tin plating By conducting the above process, the electronic device 20 is completed that is structured as the coreless package with no core substrate and has the external mounting electrodes protruding from the bottom of the electronic device.

The electronic device 20 thus fabricated is mounted on an external connection mounting substrate through solders, and the bonding strength (shear strength) between the electronic device 20 and the mounting substrate is measured. As a result, by virtue of the reinforcing effect that the PSR film 4 as an insulation layer is securely bonded to the sealing resin 23 and of the increase of contact area between the external connection mounting terminal 24 and the solder, it is confirmed that the bonding structure of the coreless package (with electrode dimensions of 0.25 mm×0.18 mm×0.018 mm) of this embodiment has two times or more strength than that of the conventional coreless package (with electrode dimensions of 0.15 mm×0.15 mm and no thickness) tentatively manufactured.

Effects of the Second Embodiment

The following effects can be obtained by the second embodiment of the invention.

(1) In the base material 11, the adhesion force between the metal layer 3 and the metal film 2 with the release layer is smaller than that between the metal layer 3 and the PSR film 4. Thus, the tape member 1 with the metal layer 2 can be surely removed from the electronic device 10 by utilizing the release layer. No crack is caused by that release stress and the metal layer 3 can be easy and securely left on the side of the electronic device substrate 10'. Therefore, the remainder such as adhesive to the metal layer 3 on the side of electronic device substrate 10' or the film breaking caused in case of using the film substrate can be eliminated.

(2) The electronic device 20 can be constructed that is formed with a coreless type suited to a low-profile device and has the protruding terminal 24 suited to external mounting on the back side of the electronic device.

(3) The external mounting protruding terminal 24 is processed by chemical etching as a technology of photo fabrication from the metal layer 3 with an even thickness. Thus, it can be uniform in thickness and width and have high position accuracy.

Figure 11:
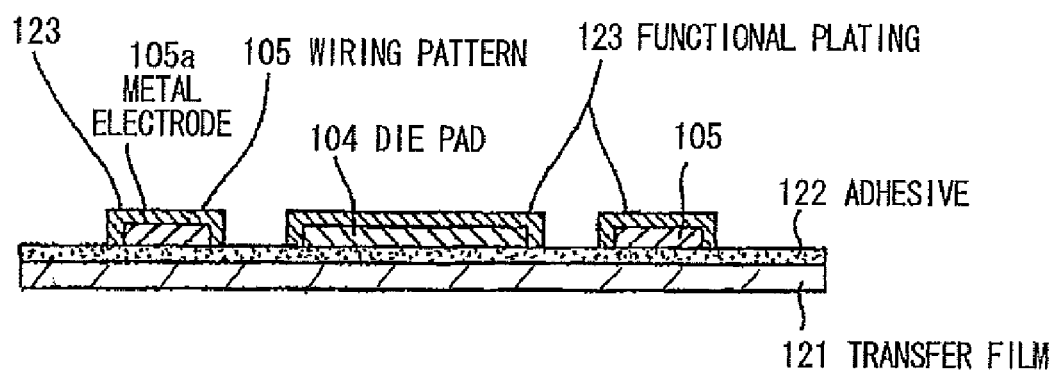
FIG. 11 is a cross sectional view showing the detailed structure of a transfer film in FIG. 10A.

(4) The external mounting protruding terminal 24 is processed from a thin metal material with a thickness of about 18 μm. Thus, the material is suited to microscopic processing as compared to solder balls for the BGA, and it does not limit the downsizing of electronic device in volume and thickness. Further, the protruding shape allows the connection to the external mounting solder both at the side and at the top of the protruding terminal. In contrast, the conventional coreless package (See FIG. 11) allows the connection to the external mounting solder only at the top of the external mounting metal electrode 105a. Thus, in this embodiment, the contact area to the external mounting solder can be increased as compared to the conventional coreless package and the same connection strength as BGA can be obtained.

(5) The PSR film 4 located at the side of the metal plating layer 13 can allow an increase in connection strength of the sealing resin 23 covering the metal plating layer 13 and the electronic parts 21, and serves as a reinforcing member to enhance the mechanical durability during the manufacturing process of the electronic device. Thus, the electronic device can be produced with high mechanical strength as well as being rendered low-profile.

(6) The tape member 1 with heat resistance is bonded to the composite metal layer 12. Therefore, durability to the thermal and mechanical stress can be increased during the substrate processing and the device assembling.

(7) The composite metal layer 12 and the tape member 1 are balanced in thickness. Therefore, the polyimide tape 8 can be removed easily and smoothly.

(8) Due to having the support substrate, the electronic device substrate can be securely processed even when the metal layer 3 is formed of the rolled copper foil with a thickness of less than 20 μm. Therefore, the protruding terminal 24 can be less than 20 μm in height at the bottom side of the electronic device.

Although in the second embodiment the metal layer 3 is formed of the 18 μm thick rolled copper foil, it may be formed of an electrolytic copper foil or another metal foil. Further, by using a further thin metal foil, load in the removal process in chemical or mechanical polishing can be reduced.

Third Embodiment

Composition of Electronic Device

Figure 5:
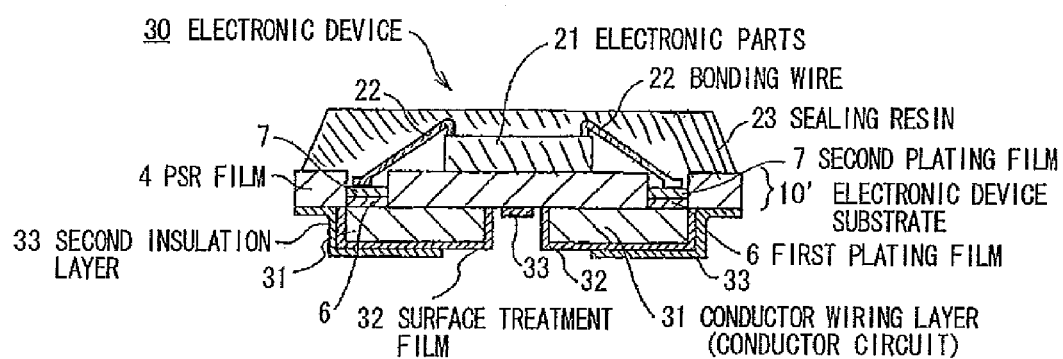
FIG. 5 is a cross sectional view showing an electronic device substrate in a third preferred embodiment according to the invention.

FIG. 5 is a cross sectional view showing an electronic device substrate in the third preferred embodiment according to the invention.

The electronic device 30 comprises: an electronic device substrate 10' that is formed by removing the base material 11 from the electronic device substrate 10 of the first embodiment; an electronic parts 21 mounted at a predetermined position on the electronic device substrate 10'; bonding wires 22 that connects an external connection terminal (not shown) on the electronic parts 21 to the second plating film 7 of the electronic device substrate 10'; a sealing resin 23, as insulating covering material, formed on the electronic device substrate 10' to cover the electronic parts 21, the bonding wires 22 and the second plating film 7; a conductor wiring layer (or conductor circuit) 31 formed on the back surface of the PSR film 4 and contacting the first plating film 6; a surface treatment film 32 formed on the surface of the conductor wiring layer (or conductor circuit) 31; and a second insulation layer 33 covering partially the surface treatment film 32.

This embodiment has a feature that the conductor wiring layer (or conductor circuit) 31 is formed at the bottom of the PSR film 4 under the electronic parts 21 so as to reduce the mounting area of the electronic device 30.

Method of Making the Electronic Device

A method of making the electronic device of the third embodiment will be explained below. FIGS. 6A to 6K are cross sectional views showing the method of making the electronic device in FIG. 5.

First, as shown in FIG. 6B, the electronic parts 21 (which is exemplified by an IC chip in this embodiment) is bonded through a die bonding paste at a predetermined position on of the PSR film 4 of the electronic device substrate 10 as shown in FIG. 6A (and which is also shown in FIG. 1). Then, as shown in FIG. 6C, the aluminum electrode terminal of the electronic parts 21 is electrically connected through the gold bonding wires 22 to the second plating film 7 of the electronic device substrate 10.

Then, as shown in FIG. 6D, the sealing resin 23 is formed on the electronic parts 21, the bonding wires 22 and the second plating film 7 so as to protect the electronic parts 21 and the bonding portions from the external environment. Then, as shown in FIG. 6E, the tape member 1 with the metal layer 2 is separated from the metal layer 3 to expose the metal layer 3 and to have an IC package 26 (See FIG. 6F).

The seven-layer composition as shown in FIG. 6D is, in the order from the top layer, the sealing resin 23 or the electronic parts 21 with the die bonding paste or the bonding wires 22 (gold wires)/the PSR film 4 or the first and second plating films 6, 7/the rolled copper foil (=metal layer 3)/the release layer (not shown)/the ultra-thin copper foil (=metal film 2)/the adhesive 9 (See FIG. 2B)/the support substrate (=the polyimide tape 8: See FIG. 2B). Above all, the adhesion force at the interface of the rolled copper foil (=metal layer 3) and the ultra-thin copper foil (=metal film 2) through the release layer is 20 N/m considerably small as compared to the adhesion force, greater than 1000 N/m, at the other interfaces. Therefore, the tape member 1 with the metal layer 2 and the release layer can be securely separated from the metal layer 3 to expose the bottom of the metal layer 3 (=rolled copper foil) as shown in FIG. 6F.

Figure 6G:
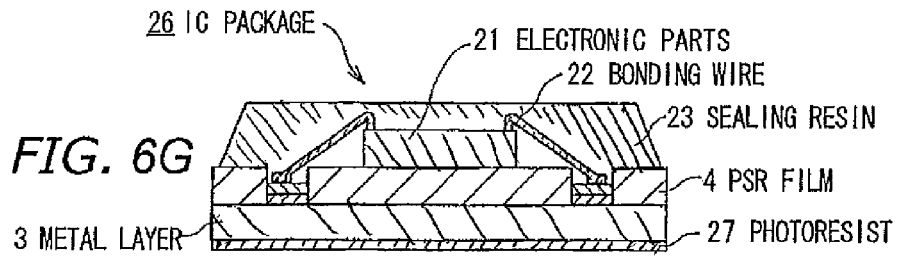
Figure 6H:
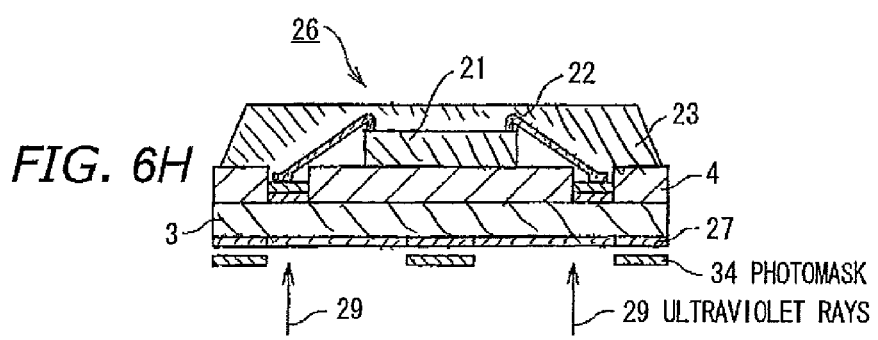
Figure 6I:
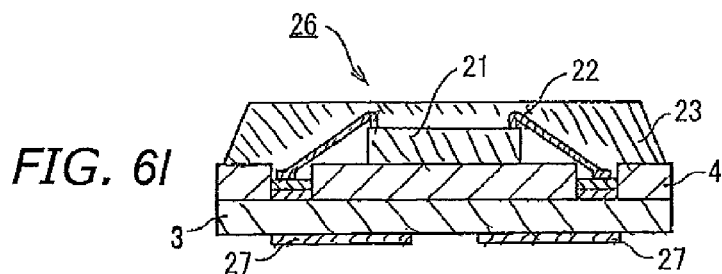

Then, as shown in FIG. 6G, a negative type photoresist 27 is coated on the surface of the metal layer 3 at the bottom of the IC package 26. Then, as shown in FIG. 6H, ultraviolet rays 29 are irradiated through a photomask 34 with a predetermined mask pattern corresponding to a desired wiring pattern from the bottom side of the electronic device. Then, as shown in FIG. 6I, a developing solution is sprayed thereon to remove the photoresist 27 at the position where the ultraviolet rays are not irradiated.

Figure 6J:
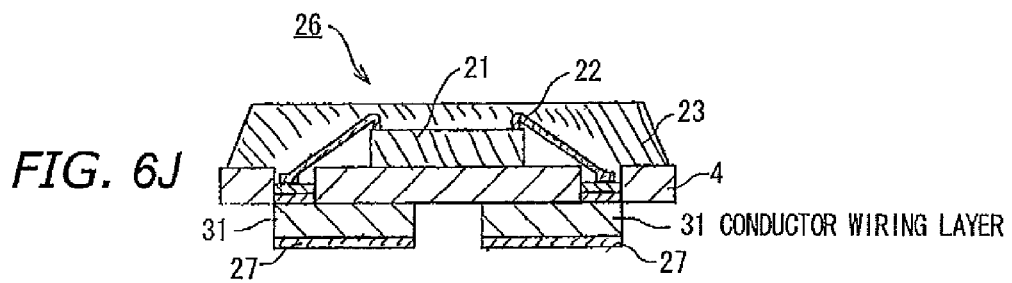

Then, as shown in FIG. 6J, the copper foil (=metal layer 3) at the position where the photoresist 27 is removed is chemically etched by etchant to form the conductor wiring layer (or conductor circuit) 31. Since the PSR film 4 is formed of the insoluble solder resist or photo-solder resist, it serves as a protection film in the chemical etching so as not to cause the penetration of the etchant into the inside of the electronic device.

Figure 6K:
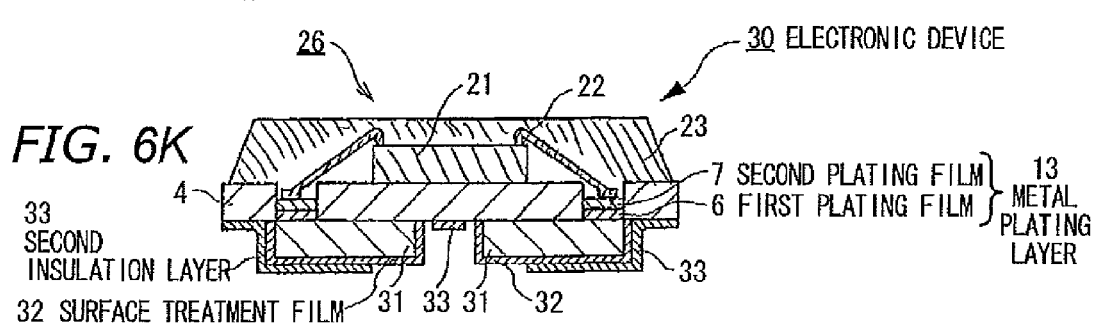

After the chemical etching, the remaining resist is removed by spraying a resist removing solution. Finally, as shown in FIG. 6K, the surface treatment film 32 is formed on the surface of the conductor wiring layer (or conductor circuit) 31 by electroless tin plating. Optionally, when the conductor wiring layer (or conductor circuit) 31 is formed, unnecessary parts in the external mounting are preferably covered with photo-solder resist as the second insulation layer 33.

By conducting the above process, the electronic device 30 is completed that is structured as the coreless package with no core substrate and has the conductor wiring layer (or conductor circuit) 31 protruding from the bottom of the electronic device.

The electronic device 30 thus fabricated is mounted on an external connection mounting substrate through solders, and the bonding strength (shear strength) between the electronic device 30 and the mounting substrate is measured. As a result, by virtue of the reinforcing effect that the PSR film 4 as an insulation layer is securely bonded to the sealing resin 23 and of the increase of contact area between the external connection conductor wiring layer (or conductor circuit) 31 and the solder, it is confirmed that the bonding structure of the coreless package (with electrode dimensions of 0.25 mm×0.18 mm×0.018 mm) of this embodiment has two times or more strength than that of the conventional coreless package (with electrode dimensions of 0.15 mm×0.15 mm and no thickness) tentatively manufactured. Thus, it is confirmed that this embodiment can have the same effect as the second embodiment.

Due to having the PSR film 4 as insulation layer under the electronic parts 21, the electronic device 30 of this embodiment can allow the deposition of the conductor wiring layer (or conductor circuit) 31 under the electronic parts 21 to reduce the mounting area. This is very advantageous in the case that the electronic device 30 has many external connection terminals (i.e., in case of a multiterminal electronic device).

In general, external connection terminals for electronic device are formed to have a width greater than a producible microscopic wiring width of an electronic device substrate so as to increase connection strength to a solder used to connect the electronic device with a mounting substrate. Also, distance (separation distance: D) between adjacent external connection terminals is set to be greater than a producible microscopic wiring distance of an electronic device substrate so as to prevent the solder electrical short circuit (i.e., solder bridge) between the terminals. Thus, in general, the mounting area of a multiterminal electronic device depends on the design of the external connection terminal.

FIGS. 7A to 7D illustrate a comparison between the structure of a conventional coreless package and the structure of an electronic device in the third preferred embodiment of the invention wherein the separation distance D is set constant.

Figure 7A:
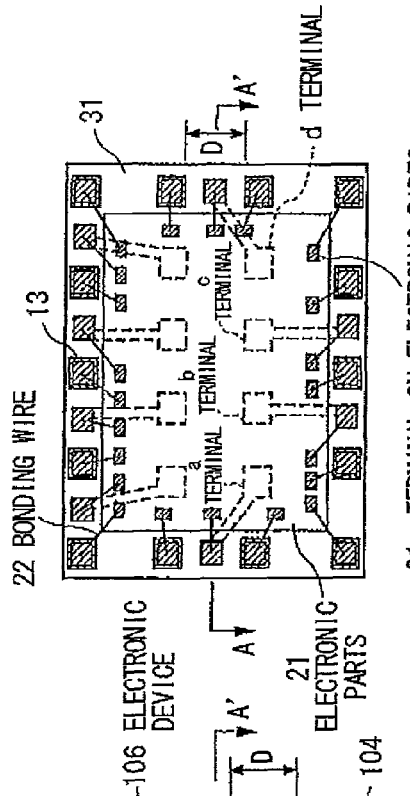
FIGS. 7A to 7D illustrate a comparison between the structure of a conventional coreless package and the structure of an electronic device in a third preferred embodiment of the invention wherein a separation distance D is set constant, where
Figure 7C:
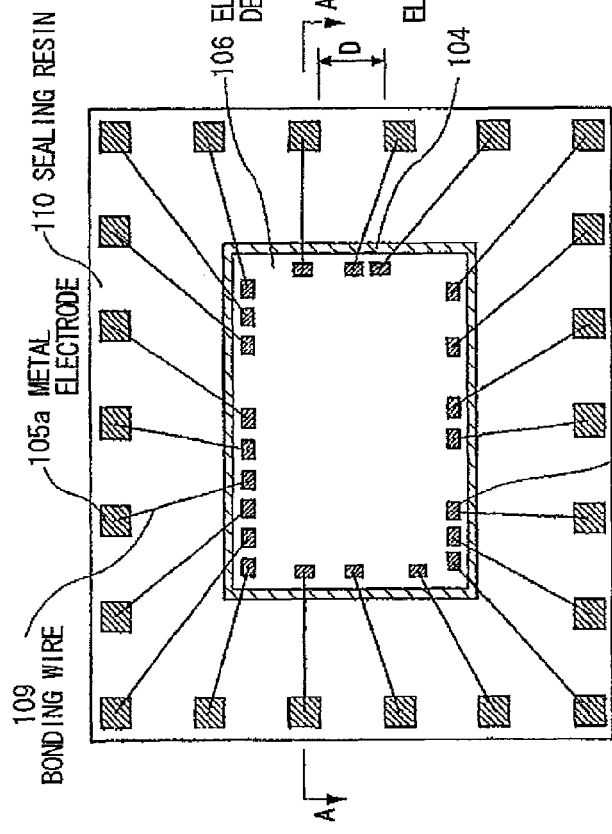
Figure 7B:
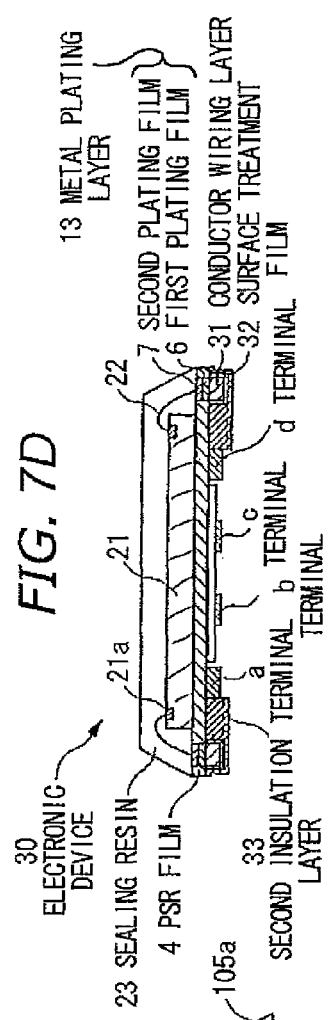
Figure 7D:
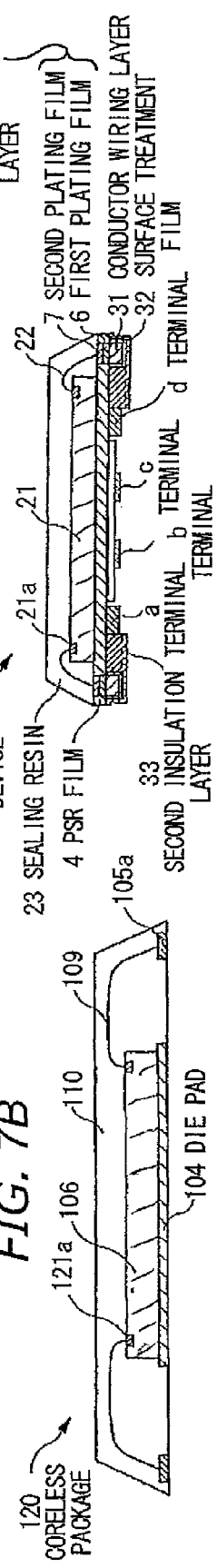
Figure 8A:
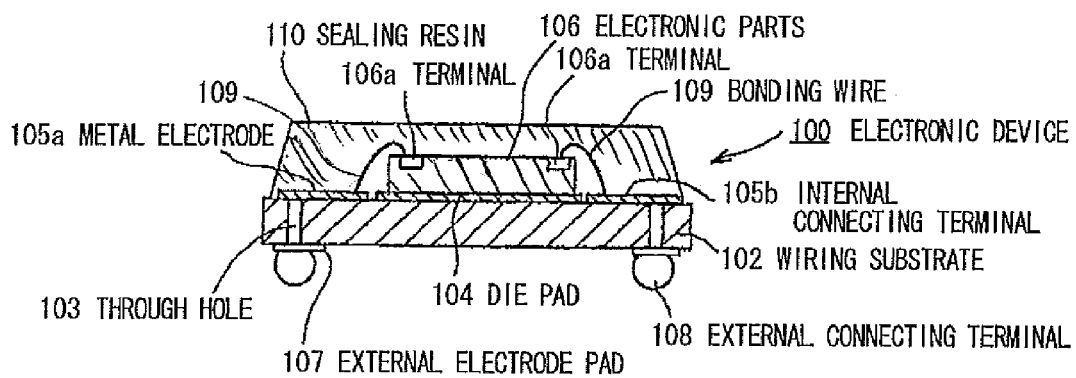
FIG. 8A is a cross sectional view showing the conventional electronic device.
Figure 8B:
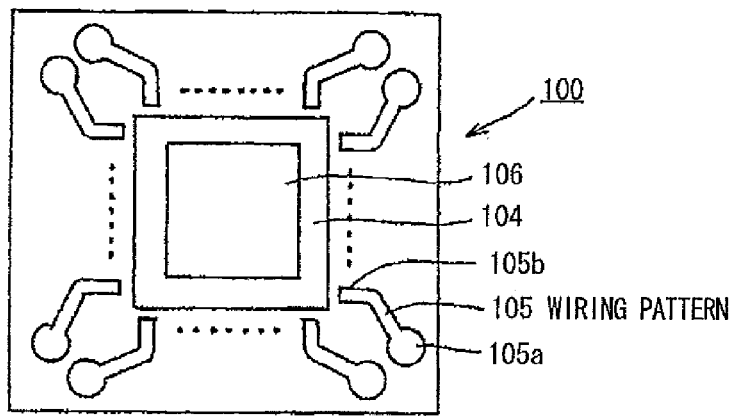
FIG. 8B is a top view showing a mounting surface of the electronic parts in FIG. 8A.
Figure 9:
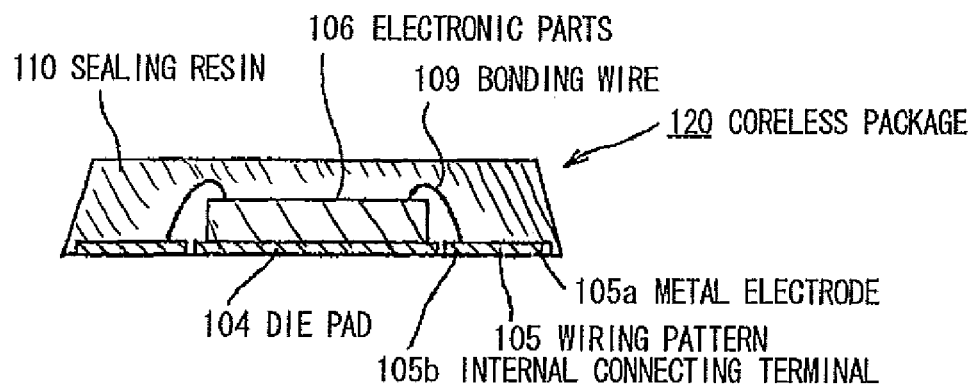
FIG. 9 is a cross sectional view showing the conventional electronic device with a coreless package structure.
Figure 10A:
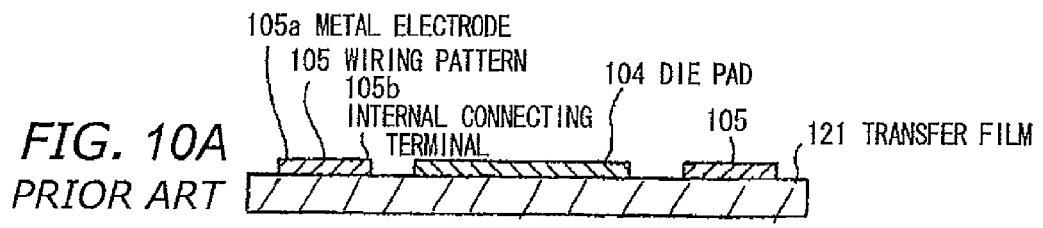
FIGS. 10A to 10E are cross sectional views showing a method of making the electronic device in FIG. 9.
Figure 10B:
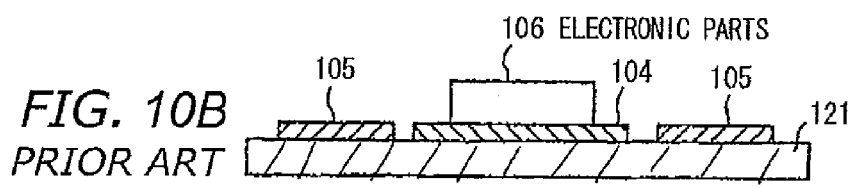
Figure 10C:
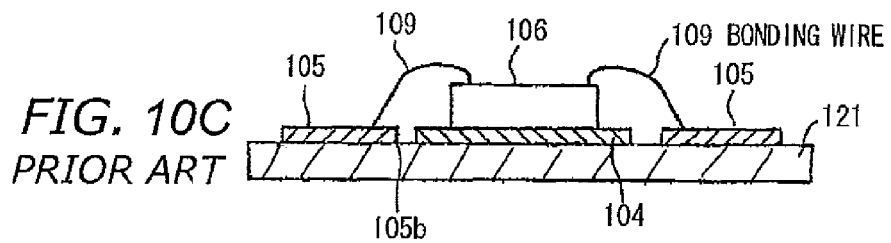
Figure 10D:
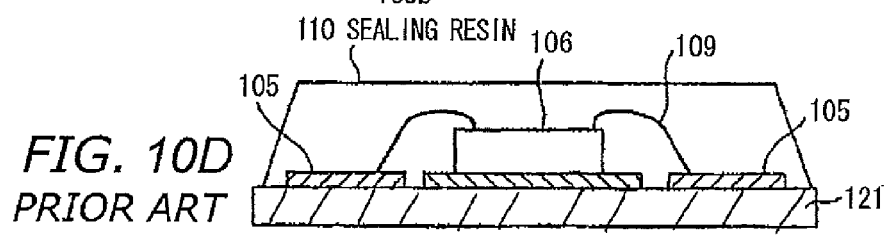
Figure 10E:
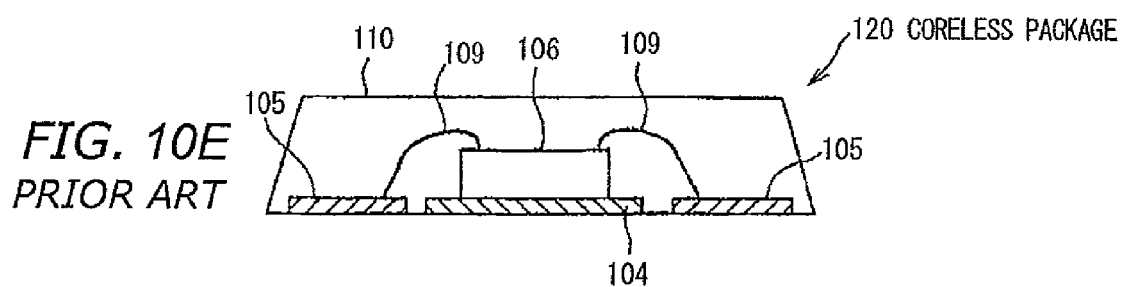

As shown in FIGS. 7A and 7B, the conventional coreless package 120 has a die pad 104 and, therefore, it is not possible to form the metal electrode 105*a* as an external terminal under the electronic parts 21. Because of this, all of the metal terminals 105*a* have to be disposed on the periphery of an electronic device 106.

In contrast, the multiterminal electronic device 30 (with 22 external terminals) of this embodiment can allow the reduction of mounting area down to about 70% of that of the conventional coreless package 120 (with 22 external terminals)

Effects of the Third Embodiment

The following effects can be obtained by the third embodiment of the invention.

(1) In the base material 11, the adhesion force between the metal layer 3 and the metal film 2 with the release layer is smaller than that between the metal layer 3 and the PSR film 4. Thus, the tape member 1 with the metal layer 2 can be surely removed from the electronic device 10 by utilizing the release layer. No crack is caused by that release stress and the metal layer 3 can be easy and securely left on the side of the electronic device substrate 10'. Therefore, the remainder such as adhesive to the metal layer 3 on the side of electronic device substrate 10' or the film breaking caused in case of using the film substrate can be eliminated.

(2) The electronic device 30 can be constructed that is formed with a coreless type suited to a low-profile device and has the conductor wiring layer 31 suited to external mounting on the back side of the electronic device.

(3) The external mounting conductor wiring layer 31 is processed by chemical etching as a technology of photo fabrication from the metal layer 3 with an even thickness. Thus, it can be uniform in thickness and width and have high position accuracy.

(4) The external mounting conductor wiring layer 31 is processed from a thin metal material with a thickness of about 18 μm. Thus, the material is suited to microscopic processing as compared to solder balls for the BGA, and it does not limit the downsizing of electronic device in volume and thickness. Further, the protruding shape of the conductor wiring layer 31 allows the connection to the external mounting solder both at the side and at the top of the external mounting terminal portion of the conductor wiring layer 31. In contrast, the conventional coreless package (See FIG. 11) allows the connection to the external mounting solder only at the top of the external mounting metal electrode 105*a*. Thus, in this embodiment, the contact area to the external mounting solder can be increased as compared to the conventional coreless package and the same connection strength as BGA can be obtained.

(5) The PSR film 4 located at the side of the metal plating layer 13 can allow an increase in connection strength of the sealing resin 23 covering the metal plating layer 13 and the electronic parts 21, and serves as a reinforcing member to enhance the mechanical durability during the manufacturing process of the electronic device. Thus, the electronic device can be produced with high mechanical strength as well as being rendered low-profile.

(6) The tape member 1 with heat resistance is bonded to the composite metal layer 12. Therefore, durability to the thermal and mechanical stress can be increased during the substrate processing and the device assembling.

(7) The composite metal layer 12 and the tape member 1 are balanced in thickness. Therefore, the polyimide tape 8 can be removed easily and smoothly.

(8) Due to having the support substrate, the electronic device substrate can be securely processed even when the metal layer 3 is formed of the rolled copper foil with a thickness of less than 20 μm. Therefore, the conductor wiring layer (or conductor circuit) 31 can be less than 20 μm in height at the bottom side of the electronic device.

(9) Due to having the PSR film 4 under the electronic parts 21, the conductor wiring layer (or conductor circuit) 31 can be formed to reduce the mounting area of the electronic device 30.

Although in the third embodiment the metal layer 3 is formed of the 18 μm thick rolled copper foil, it may be formed of an electrolytic copper foil or another metal foil. Further, by using a further thin metal foil, load in the removal process in chemical or mechanical polishing can be reduced.

Other Embodiments

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, although in the above embodiments the support substrate is formed of the laminated polyimide film 8 during the manufacturing of the electronic device substrate, the polyimide film may be omitted if the handling during the manufacturing is possible.

The electrical connection between the conductor terminal and the electronic parts can be made by a flip-chip connection instead of the wire bonding.

Although in the above embodiments the metal plating layer is formed of the two-layer plating structure of gold/nickel prepared for the wire bonding, it can be formed of an arbitrary combination of suitable materials and thicknesses according to the electrical connection method of the electronic parts to the substrate or to the mounting method of the fabricated package to a printed-circuit board.

Although in the above embodiments the surface treatment layer (or functional plating) of tin plating is formed on the surface of the protruding terminal or the conductor wiring layer formed at the bottom of the electronic device, it may be formed of gold plating for the mounting by soldering, NCP, ACF etc.

Although in the above embodiments the number of the electronic parts 21 mounted on the one electronic device is one, plural electronic parts can be mounted thereon to compose a multi-chip package. Further, this invention can be applied to the case that plural electronic parts are arrayed and mounted in a unit area, it is resin-sealed integrally and it is cut into small pieces corresponding to a unit parts by dicing.

What is claimed is:

1. An electronic device substrate, comprising:
a base material formed of a thin board;
an electrical insulation layer formed on the base material and comprising a plurality of openings in a thickness direction thereof;
a metal plating layer filled in the plurality of openings,
the base material comprising a metal layer contacting the metal plating layer, a release layer formed contacting the metal layer, a metal film formed contacting the release layer, and a supporting substrate configured to be separable from the metal layer together with the metal film by using the release layer,
wherein the metal layer, the release layer, the metal film and the supporting substrate are formed in this order from a side of the electrical insulation layer.

2. The electronic device substrate according to claim 1, wherein:
the base material comprises, formed in order from the electrical insulation layer, the metal layer, the release layer, the metal layer, a tape member, and an adhesion force between the metal layer and the release layer with the metal film is smaller than that between the metal layer and the electrical insulation layer.

3. The electronic device substrate according to claim 1, wherein:
the electrical insulation layer comprises a solder resist, a photo-solder resist or a polyimide film.

4. The electronic device substrate according to claim 1, wherein:
the metal plating layer comprises any one of gold, silver, copper, nickel, palladium, tin, rhodium and cobalt or an alloy thereof or laminated layers each formed of any one thereof or an alloy thereof.

* * * * *